US007576473B2

(12) United States Patent
Berlemont et al.

(10) Patent No.: US 7,576,473 B2
(45) Date of Patent: Aug. 18, 2009

(54) METHOD OF OPERATING A PIEZOELECTRIC ACTUATOR

(75) Inventors: Jean-Francois M.R. Berlemont, Wemmel (BE); Jean-Pierre Winandy, Arlon (BE)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 12/012,099

(22) Filed: Jan. 31, 2008

(65) Prior Publication Data

US 2008/0184967 A1 Aug. 7, 2008

(30) Foreign Application Priority Data

Feb. 2, 2007 (EP) ................................ 07250454

(51) Int. Cl.
*H01L 41/00* (2006.01)
*H02N 2/00* (2006.01)

(52) U.S. Cl. ................. 310/316.03; 123/480; 123/498; 239/102.2

(58) Field of Classification Search ................. 123/480, 123/490, 498; 239/102.2; 310/316.03
See application file for complete search history.

(56) References Cited

U.S. PATENT DOCUMENTS

| | | | | |
|---|---|---|---|---|
| 6,081,062 | A * | 6/2000 | Hoffmann et al. | 310/316.03 |
| 6,155,500 | A * | 12/2000 | Takase | 239/533.3 |
| 6,619,268 | B2 * | 9/2003 | Rueger et al. | 123/498 |
| 6,732,715 | B2 * | 5/2004 | Fallahi et al. | 123/480 |
| 6,772,735 | B2 * | 8/2004 | Boss et al. | 123/467 |
| 6,845,759 | B2 * | 1/2005 | Ohnishi et al. | 123/478 |
| 6,912,998 | B1 * | 7/2005 | Rauznitz et al. | 123/490 |
| 2004/0057189 | A1 * | 3/2004 | Cheever et al. | 361/160 |
| 2007/0018534 | A1 * | 1/2007 | Sciortino et al. | 310/316.01 |
| 2007/0273246 | A1 * | 11/2007 | Hopley et al. | 310/317 |
| 2007/0273247 | A1 * | 11/2007 | Hargreaves et al. | 123/490 |

FOREIGN PATENT DOCUMENTS

| | | |
|---|---|---|
| EP | 1400677 | 3/2004 |
| EP | 1628010 | 2/2006 |
| EP | 1746318 | 1/2007 |
| GB | 2366664 | 3/2002 |

* cited by examiner

*Primary Examiner*—Stephen K Cronin
*Assistant Examiner*—David Hamaoui
(74) *Attorney, Agent, or Firm*—Thomas N. Twomey

(57) ABSTRACT

A method of operating an injector having an injector valve needle and a piezoelectric actuator for controlling movement of the injector valve needle, the method comprising reducing the voltage across the actuator at a first rate (RT1) in order to initiate an initial injection, increasing the voltage across the actuator in order to terminate the injection, and once the initial injection has terminated and before a subsequent injection is initiated, reducing the voltage across the actuator at a second rate (RT2; RT3), which is lower than the first rate (RT1), so as to de-energise the actuator but without initiating an injection. The invention ensures the injector spends a significantly reduced period of its life with a high voltage across its actuator.

17 Claims, 4 Drawing Sheets

METHOD OF OPERATING A PIEZOELECTRIC ACTUATOR

TECHNICAL FIELD

The invention relates to a method of operating a piezoelectric actuator. More specifically, the invention relates to a method of operating a piezoelectrically actuated fuel injector in order to improve injector life. The invention also relates to a drive circuit for implementing the method of the invention.

BACKGROUND TO THE INVENTION

In a direct injection internal combustion engine, a fuel injector is provided to deliver a charge of fuel to a combustion chamber prior to ignition. Typically, the fuel injector is mounted in a cylinder head with respect to the combustion chamber such that its tip protrudes slightly into the chamber in order to deliver a charge of fuel into the chamber.

One type of fuel injector that is particularly suited for use in a direct injection engine is a so-called piezoelectric injector. Such an injector allows precise control of the timing and total delivery volume of a fuel injection event. This permits improved control over the combustion process which is beneficial in terms of exhaust emissions.

A known piezoelectric injector 2 and its associated control system 4 are shown schematically in FIG. 1. The piezoelectric injector 2 is controlled by an injector control unit 6 (ICU) that forms an integral part of an engine control unit 8 (ECU). The ECU 8 monitors a plurality of engine parameters 10 and calculates an engine power requirement signal (not shown) which is input to the ICU 6. In turn, the ICU 6 calculates a required injection event sequence to provide the required power for the engine and operates an injector drive circuit 12 accordingly. The injector drive circuit 12 is connected to the injector 2 by way of first and second power supply leads 14, 16 and is operable to apply a differential voltage to the injector 2, via the leads 14, 16.

The piezoelectric injector 2 includes a piezoelectric actuator 18 that is operable to control the position of an injector valve needle 20 relative to a valve needle seat 22. The piezoelectric actuator 18 includes a stack 24 of piezoelectric elements that expands and contracts in dependence on the differential voltage supplied by the drive circuit 12. The axial position, or 'lift', of the valve needle 20 is controlled by varying the differential voltage across the actuator 18.

By application of an appropriate voltage differential across the actuator 18, the valve needle 20 is either caused to disengage the valve seat 22, in which case fuel is delivered into an associated combustion chamber (not shown) through a set of nozzle outlets 26, or is caused to engage the valve seat 22, in which case fuel delivery through the outlets 26 is prevented.

A piezoelectrically controlled injector of the aforementioned type is described in the Applicant's European Patent Numbers EP 1174615 B and EP 0995901 B. The injector 2 is of the deenergise-to-inject type in which a reduction in the voltage across the actuator 18 initiates an injection event. As an injector spends the majority of its life in a non-injecting state, in injectors of the deenergise-to-inject type the voltage across the actuator 18 is relatively high for the majority of its life (at least 90%). It has been identified that this may have a detrimental effect on injector service life as a correlation exists between the life of the piezoelectric actuator and the amount of time for which the actuator has a relatively high voltage across it.

It is an object of the present invention to provide an improved method of operating a piezoelectrically actuated fuel injector which alleviates the aforementioned problem.

SUMMARY OF THE INVENTION

According to a first aspect of the present invention, there is provided a method of operating an injector having an injection valve needle and a piezoelectric actuator for controlling movement of the injector valve needle, the method comprising reducing the voltage across the actuator at a first rate in order to initiate an initial injection, increasing the voltage across the actuator in order to terminate the injection, and once the initial injection has terminated and before a subsequent injection is initiated, reducing the voltage across the actuator at a second rate, which is lower than the first rate, so as to de-energise the actuator but without initiating an injection.

In a second aspect, the invention provides a method of operating a fuel injector having an injector valve needle, a valve needle seat engageable with the injector valve needle and a piezoelectric actuator for controlling movement of the injector valve needle relative to the valve needle seat, the method comprising: reducing the voltage across the actuator at a first rate in order to initiate a first fuel injection event; increasing the voltage across the actuator in order to terminate said first fuel injection event; and once the first fuel injection event has terminated and before a second fuel injection event is initiated, reducing the voltage across the actuator at a second rate, said second rate being too slow to initiate a fuel injection event, and wherein said second rate is a function of the voltage across the actuator.

The methods of the invention may be used to operate a piezoelectric fuel injector in which the actuator is coupled to the injector valve needle, for example through a hydraulic coupling, whereby extension and contraction of the actuator results in movement of the valve needle towards and away from a valve seating to control injection through injector outlets. De-energisation of the actuator results in a contraction of the actuator, which in turn causes the valve needle to lift to commence injection.

In normal operation, in order to initiate the injection event the actuator is de-energised at a relatively high rate (i.e. the voltage across the actuator is reduced rapidly). To terminate the injection event the voltage across the actuator is increased. It has now been recognised that if, between the initial injection and a subsequent injection, the actuator is de-energised relatively slowly, (i.e. the voltage across the actuator is reduced slowly), an injection does not occur. The invention therefore allows the voltage across the actuator to be reduced between injections, so as to reduce the proportion of time for which the actuator experiences a relatively high voltage across it, but without initiating an injection. This benefits the life of the actuator and, hence, prolongs the service life of the injector.

In one embodiment of the invention, the voltage across the actuator may be increased after it has been reduced at the second rate, prior to a further subsequent injection. This ensures greater accuracy and repeatability of the control of injection events.

The voltage across the actuator may be reduced at the second rate as a function of time which has elapsed since the initial injection. For a multiple injection sequence, for example, this can be used to ensure that all injections of the sequence (e.g. pilot, main, post) have completed between the actuator is discharged at the second rate. For example, the voltage across the actuator may be reduced at the second rate a predetermined time after the initial injection.

In one particular example, the initial injection is an initial injection of an injection sequence and the subsequent injection is a subsequent injection of the same injection sequence. Therefore, the initial injection may be a pilot injection of the injection sequence and the subsequent injection may be a main injection of the same injection sequence.

Alternatively, the initial injection may be a pilot injection of the injection sequence and the subsequent injection may be a further pilot injection of the same injection sequence.

In an alternative embodiment, the initial (or first) and subsequent (or second) fuel injection events are not consecutive within a fuel injection sequence. For example, the initial (or first) injection event may be an injection event of a first injection series, and the subsequent (or second) fuel injection event is an injection event of a second injection series.

In a particular further alternative, the initial injection is a main injection of a first sequence and the subsequent injection is a main injection of a second, later sequence. In this case it is much more desirable to re-establish the initial high voltage across the actuator before the subsequent injection is initiated.

In another embodiment, the method may be used to reduce the voltage across the actuator at the second rate as a function of the voltage across the actuator.

The method may be implemented in a number of ways. For example, the method may include reducing in a passive manner the voltage across the actuator at the second rate through a resistance associated with the injector (e.g. through a resistance across terminals of the actuator).

Alternatively the method may be implemented by reducing in an active manner the voltage across the actuator at the second rate e.g. under the control of an engine control system (or unit). It may be beneficial to reduce the voltage actively, by means of the engine control system, as this affords a greater degree of control over injection and also avoids the need for additional hardware components in the form of resistive components.

According to a third aspect of the invention, there is provided a drive circuit for an injector having an injector valve needle and a piezoelectric actuator for controlling movement of the injector valve needle. The drive circuit comprises primary discharge apparatus for reducing the voltage across the actuator at a first rate in order to initiate an initial injection, apparatus for increasing the voltage across the actuator in order to terminate the injection, and secondary discharge apparatus for reducing the voltage across the actuator at a second rate, which is lower than the first rate, once the initial injection has terminated and before a subsequent injection is initiated, so as to de-energise the actuator but without initiating an injection.

In one embodiment, the primary discharge apparatus for reducing the voltage across the actuator at the first rate includes a switching circuit comprising a discharge switch for controlling discharging of the actuator through an inductive circuit.

The secondary discharge apparatus for reducing the voltage across the actuator at the second rate may include an engine control system for controlling in an active manner the discharging of the injector through the inductive circuit.

Alternatively, or in addition, the secondary discharge apparatus for reducing the voltage across the actuator at the second rate includes a resistor connected across the actuator.

Other aspects of the invention include a computer program product comprising at least one computer program software portion which, when executed in an executing environment, is operable to implement the method of the first aspect of the invention; a data storage medium having the or each computer software portion stored thereon; and a microcomputer provided with said data storage medium.

It will be appreciated that aspects of the method of the first aspect of the invention may be incorporated within the drive circuit of the second aspect of the invention, alone or in appropriate combination.

These and other aspects, objects and the benefits of this invention will become clear and apparent on studying the details of this invention and the appended claims.

BRIEF DESCRIPTION OF THE DRAWINGS

Reference has already been made to FIG. 1 which is a schematic representation of a known piezoelectric injector 2 and its associated control system.

In order that it may be more readily understood, the invention will now be described with reference also to the following figures, in which.

DETAILED DESCRIPTION OF THE PREFERRED EMBODIMENTS

All references cited herein are incorporated by reference in their entirety. Unless otherwise defined, all technical and scientific terms used herein have the same meaning as commonly understood by one of ordinary skill in the art to which this invention belongs.

The method of the present invention is applicable to a piezoelectric fuel injector of the type described with reference to FIG. 1. In particular, the invention is applicable to a piezoelectric fuel injector of the type having a piezoelectric actuator coupled to a valve needle via a coupling including a hydraulic amplifier, for example as described in the Applicant's European Patents EP 1174615 B and EP 0995901B.

Figure 1:
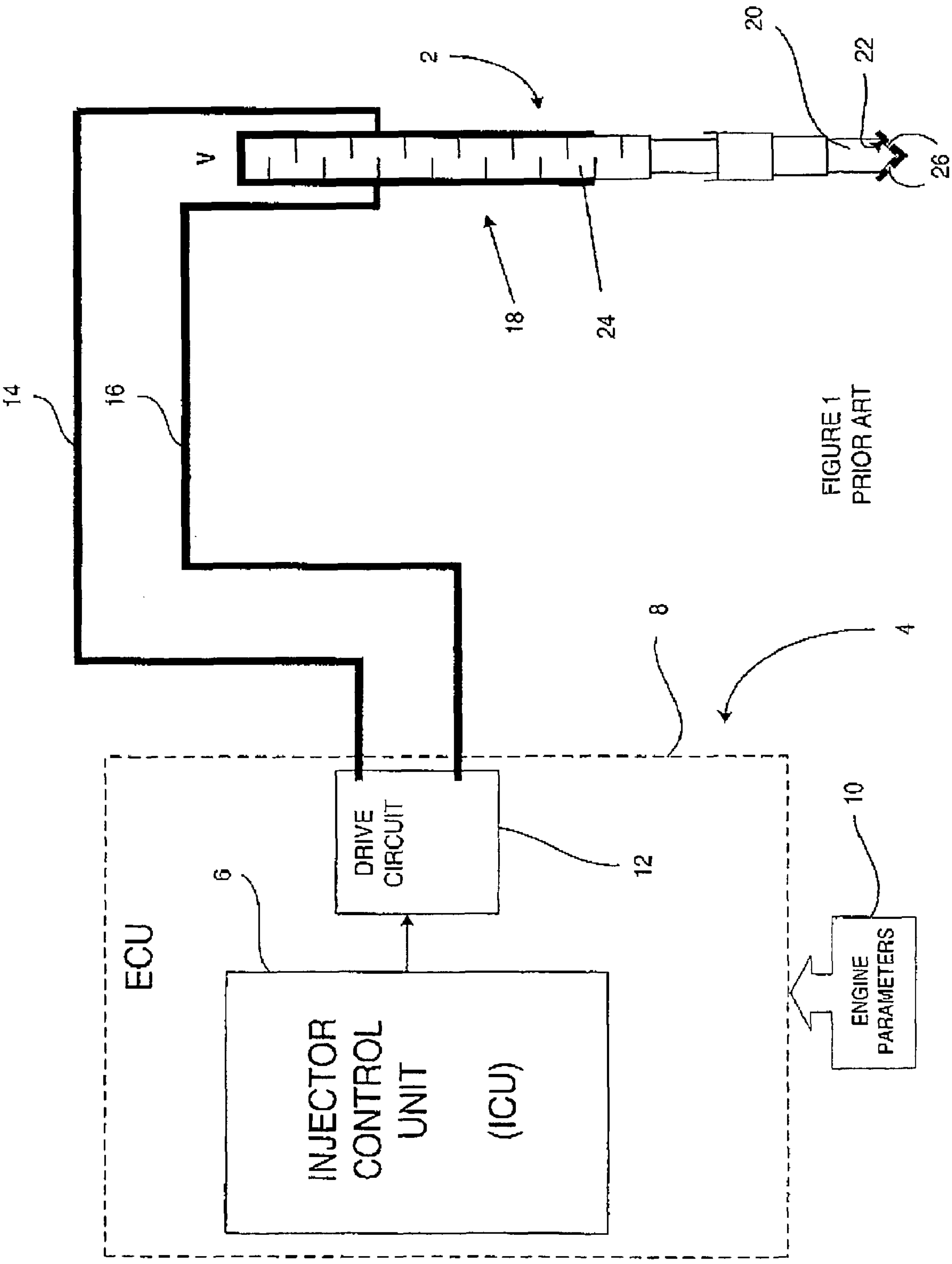
FIGURE 1 PRIOR ART

The method is implemented in an engine control unit 8, such as that shown in FIG. 1, including the injector control unit (ICU) 6 and the drive circuit 12. In a first embodiment of the invention the drive circuit differs from that shown in FIG. 1, as will be described in further detail below.

In order to initiate an injection, the injector drive circuit 12 causes the differential voltage across the actuator 18 to transition from a high level (typically 200 V) at which no fuel delivery occurs, to a relatively low level (typically between +40V and −30V), which causes the actuator 18 to contract, thus lifting the valve needle 20 away from the valve needle seat 22 to permit fuel delivery through the outlets 26. The injector is operable to deliver one or more injections of fuel within a single injection event. For example, the injection event may include one or more so-called 'pre-' or 'pilot' injections, a main injection, and one or more 'post' injections. In general, it is advantageous to have several such injections within an injection sequence to increase combustion efficiency of the engine.

Figure 2:
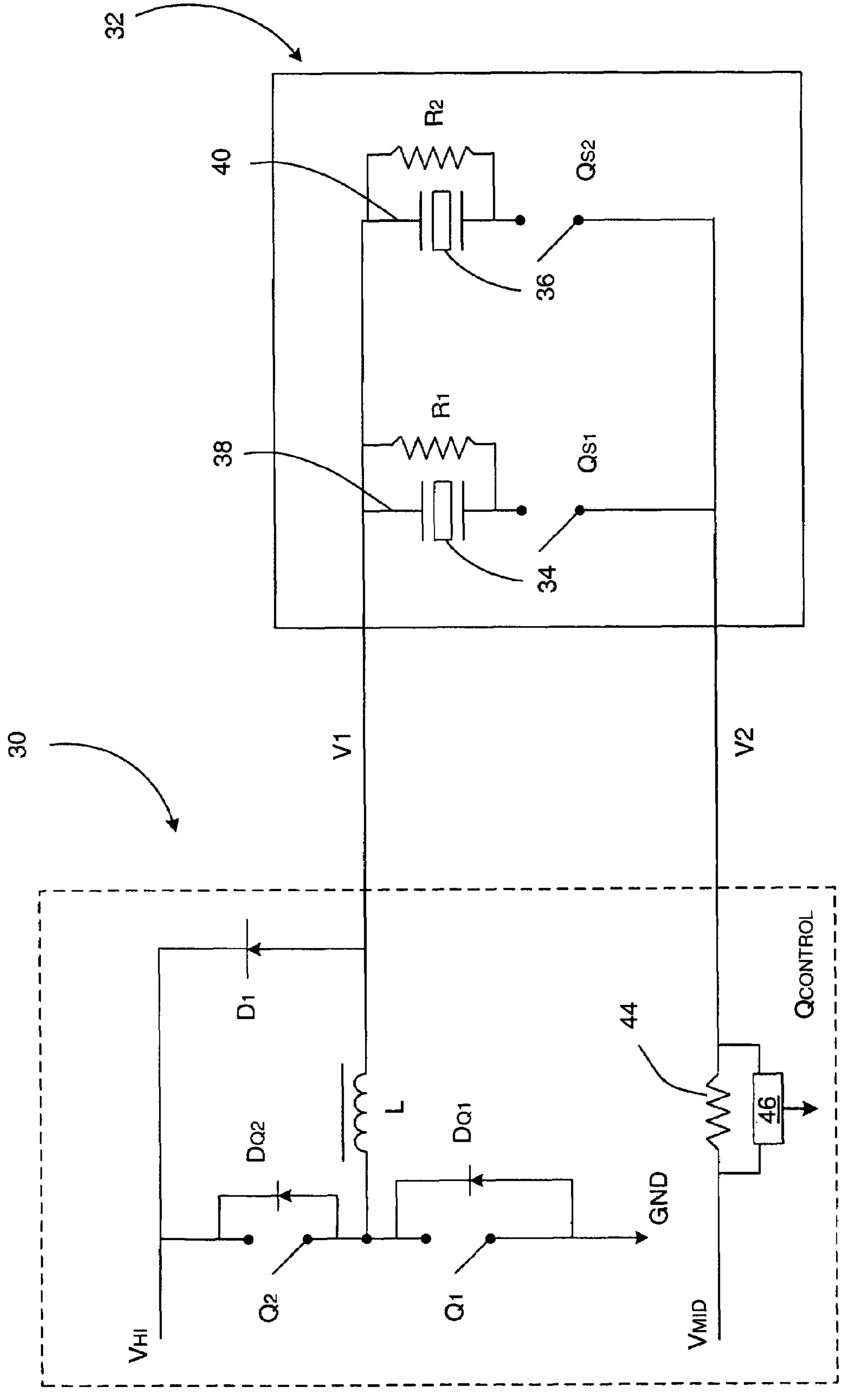
FIG. 2 is a circuit diagram of an injector drive circuit modified in accordance with the present invention.

It should be appreciated that although only one injector is shown in FIG. 1, in practice several fuel injectors would be provided under the collective control of the ICU 6 and the drive circuit 12. Referring to FIG. 2, therefore, the drive circuit of the ECU 8 is shown in more detail to include a switching circuit 30 in conjunction with an injector bank circuit 32 comprising first and second injectors, 34 and 36 respectively. Each of the injectors 34, 36 of the injector bank circuit 32 is of the type shown in FIG. 1, having a respective piezoelectric actuator.

The switching circuit 30 includes three input voltage rails: a high voltage rail $V_{HI}$ (typically 255 V), a mid voltage rail $V_{MID}$ (typically 55 V), and a ground rail GND. The switching circuit 30 also includes a high side voltage output V1 and a low side voltage output V2 and is operable to connect the high side voltage output V1 to either the high voltage rail $V_{HI}$ or the ground rail GND, through an inductor L, by means of first and second switch devices Q1, Q2. The first switch device shall be referred to as the discharge switch Q1 and the second switch device shall be referred to as the charge switch Q2. A first diode $D_{Q1}$ is connected across the discharge switch Q1 and a second diode is connected across the charge switch Q2.

The switching circuit 30 is also provided with a diode D1 that connects the high side voltage output V1 to the high voltage rail $V_{HI}$. The diode D1 is oriented to permit current to flow from the high side voltage output V1 to the high voltage rail $V_{HI}$ but to prevent current flow from the high voltage rail $V_{HI}$ to the high side voltage output V1.

The injector bank circuit 32 comprises first and second branches 38, 40, each of which is connected in parallel between the high side voltage output V1 and the low side voltage output V2 of the switching circuit 30. Thus, the high side voltage output V1 of the switching circuit 30 is also a high side voltage input to the injector bank circuit 32 and the low side voltage output V2 of the switching circuit 30 is a low side voltage input to the bank circuit 32. The first branch 38 of the injector bank circuit 32 contains the first injector 34 and the second branch 40 contains the second injector 36.

Each branch 38, 40 also includes an associated injector select switch QS1, QS2 by which means the respective one of the injectors, 34 or 36, can be selected for operation, as will be described later. Each of the injectors 34, 36 has an associated resistor, R1, R2, connected across it. By way of example, each resistor R1, R2 may be connected across terminals of the actuator of the injector (i.e. actuator 18 in FIG. 1) or may be incorporated within the stack structure of the actuator of the injector, as described in the Applicant's co-pending European patent application 05257559.4. Typically, each resistor has a value of between 300 and 500 Ohms. The optimum value of the resistors R1, R2 is selected to be a compromise between a relatively higher value required to reduce the power dissipated in the resistor and a relatively lower value required to ensure that, between injections, the voltage across the injector is reduced to a satisfactory level within a reasonable time period, as discussed further below.

Although the first and second injectors 34, 36 are shown as integral to the injector bank circuit 32, in practice the other components of the injector bank circuit 32 would be remote from the injectors 34, 36 and connected thereto by way of power supply leads.

The piezoelectric actuator of each injector 34, 36 is considered electrically equivalent to a capacitor, the voltage difference between the high and low side voltage outputs, V1, V2, determining the amount of electrical charge stored by the actuator (i.e. the voltage across the actuator) and, thus, the lift position of the valve needle of the injector.

In use, the discharge switch of the switching circuit 30, when activated, connects the high side voltage output V1 to the ground rail GND via the inductor L. Therefore, charge from the actuator of the selected injector (assume the first injector 34 is the selected injector) is permitted to flow from the injector 34, through the inductor L and discharge switch Q1 to the ground rail GND, thereby serving to discharge the selected injector 34 during an injector discharge phase. The diode $D_{Q2}$ connected across the charge switch Q2 is oriented to permit current to flow from the inductor L to the high voltage rail $V_{HI}$ when the discharge switch Q1 is deactivated, thus guarding against voltage peaks across the inductor L.

In contrast, the charge switch Q2, when activated, connects the high side voltage output V1 to the high voltage rail $V_{HI}$ via the inductor L. In circumstances where the first injector 34 is discharged, activating the charge switch Q2 causes charge to flow from the high voltage rail $V_{HI}$, through the charge switch Q2 and the inductor L, and into the first injector 34, during an injector charge phase, until an equilibrium voltage is reached (the voltage due to charge stored by the actuator of the injector 34 equals the voltage difference between the high side voltage output V1 and the low side voltage output V2). The diode $D_{Q1}$ connected across the discharge switch Q1 is oriented to permit current to flow from the ground rail GND through the inductor L to the high side voltage output V1 when the charge switch Q2 is deactivated, thus guarding against voltage peaks across the inductor L.

From the foregoing description it is apparent that the inductor L constitutes a bidirectional current path since current flows in a first direction through the inductor L during the injector discharge phase and in an opposite direction through the inductor L during the injector charge phase.

The low side voltage output V2 of the injector bank circuit 32 is connected to the mid voltage rail $V_{MID}$ via a voltage sense resistor 44. A current sensing and comparator device 46 (hereinafter referred to as the comparator module) is connected in parallel with the sense resistor 44 and is operable to monitor the current flowing through the resistor 44. In response to the current flowing through the resistor 44, the comparator module 46 outputs a control signal, $Q_{CONTROL}$, which controls the activation status of the discharge switch Q1 and the charge switch Q2 so as to regulate the peak current flowing from, or to, the selected injector 34. In effect, the comparator module 46 controls the activation status of the discharge and charge switches Q1 and Q2 to 'chop' the injector current between maximum and minimum current limits and achieve a predetermined average charge or discharge current level referred to as the 'current set point'. By this means, a high degree of control is afforded over the amount of electrical charge that is transferred from the selected injector during the injector discharge phase and, conversely, to the selected injector during the injector charge phase.

Figure 3:
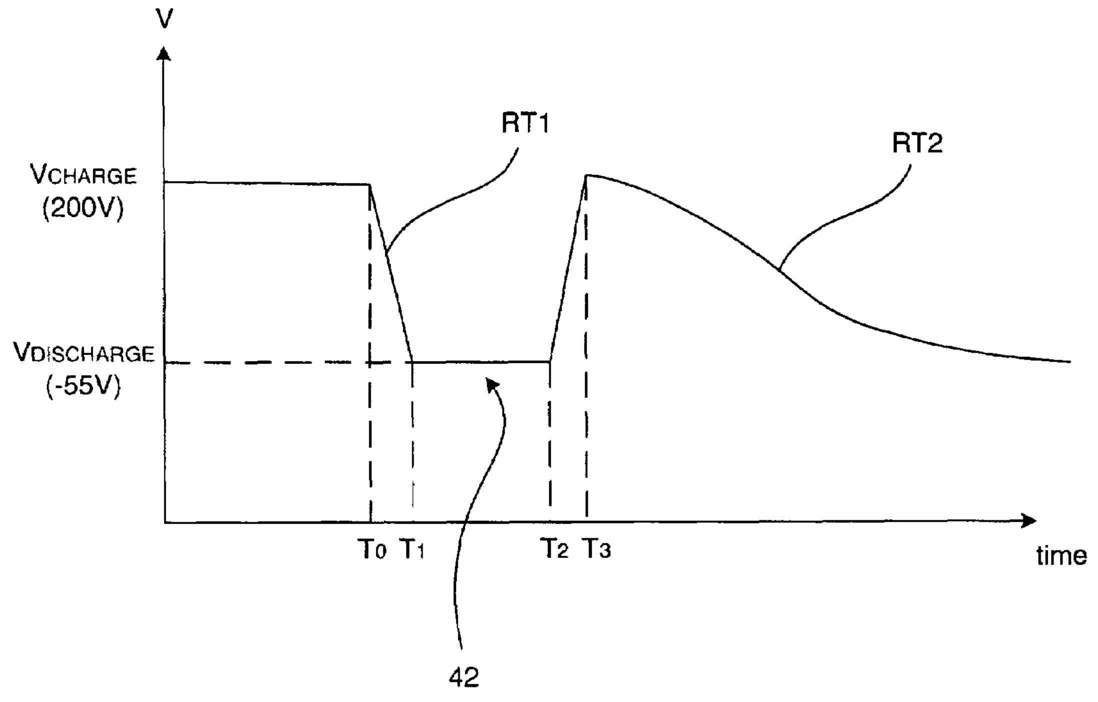
FIG. 3 is a schematic graph of voltage against time for an injection sequence having a single injection of fuel and implemented using the injector drive circuit in FIG. 2.

FIG. 3 shows a typical voltage trace for the first injector 34 for an injection sequence comprising a single injection 42 of fuel. The operation of the drive circuit 12 during a discharge phase, followed by a charge phase, in order to achieve the single injection 42 shown in FIG. 3 will now be described.

Initially, prior to time $T_0$, the actuators of both injectors 34, 36 are fully charged such that no fuel injection is taking place. In these circumstances, the ICU 6 is in a wait state awaiting an injection command signal from the ECU 8.

Following receipt of the injection command from the ECU 8, the ICU 6 selects the injector that it is required to inject by activating the appropriate injector select switch QS1 or QS2. For the purpose of the following description, the selected injector is the first injector 34. At substantially the same time (i.e. at time $T_0$ in FIG. 3), the ICU 6 initiates the discharge phase by enabling the discharge switch Q1 so as to cause the first injector 34 to discharge at a first discharge rate, RT1. Between $T_0$ and $T_1$ the current flow through the sense resistor 44 is sensed and the comparator module 46 outputs the signal $Q_{CONTROL}$ to deactivate and reactivate, repeatedly, the discharge switch Q1 such that the current remains within predetermined limits. A predetermined average discharge current level (the current set point) is therefore maintained through the first injector 34.

The ICU 6 applies the predetermined average discharge current level for a period of time (from $T_0$ to $T_1$) that is sufficient to transfer a predetermined amount of charge from the first injector 34, hence initiating an injection. The timing of the discharge phase is read from a timing map that relates discharge phase time against fuel delivery volume. The actuator discharges at a first rate indicated by RT1. At time $T_1$, the ICU 6 deactivates the first injector select switch QS1 and disables the discharge switch Q1, thus terminating the control signal $Q_{CONTROL}$, to prevent the first injector 34 discharging further. Thus, during the time period $T_0$ to $T_1$ the voltage across the injector INJ1 drops from a charged voltage level $V_{CHARGE}$ (200V) to a discharged voltage level $V_{DISCHARGE}$ (−55V). This causes the actuator of the first injector 34 to contract and, thus, causes the valve needle of the first injector 34 to lift from its seat to commence the injection of fuel.

The ICU 6 maintains the first injector 34 at the discharged voltage level $V_{DISCHARGE}$ for a predetermined dwell period, $T_1$ to $T_2$, for which the injector valve needle is held open to perform the injection. At the end of the dwell period, the ICU 6 activates the charge switch Q2, and deactivates the discharge switch S1, in order to start the injector charge phase so as to terminate injection. With the charge switch Q2 activated and the discharge switch Q1 deactivated, the high side voltage output V1 of the switching circuit 30 is connected to the high voltage rail $V_{HI}$ and charge begins to transfer onto the first injector 34.

As the current flowing into the first injector 34 increases, the comparator module 46 monitors the current flowing through the sense resistor 44 and controls the activation status of the charge switch Q2, via the control signal $Q_{CONTROL}$, to ensure a predetermined average charging current level. Between time $T_2$ and $T_3$, the ICU 6 applies the predetermined average charging current level to the first injector 34 for a period of time that is sufficient to transfer a predetermined amount of charge onto the injector 34, hence terminating the injection. At time $T_3$, the ICU 6 disables the charge switch Q2 and waits for the ECU 8 to command a subsequent injection.

At the end of the injection, the injector select switch QS1 and the charge switch Q1 are deactivated. Due to the presence of the resistor R1 across the first injector 34, the charge on the actuator of the first injector 34 will slowly discharge across the terminals of the actuator, thereby causing the voltage across the injector to decay at a second rate RT2. The value of the resistor R1 is selected to ensure that the rate of discharge RT2 of the voltage across the first injector 34 at the end of the injection is insufficient to cause a subsequent injection of fuel. This is possible because, if the actuator is caused to extend relatively slowly by discharging at a relatively low rate, it does not cause any corresponding movement of the injector valve needle due to the arrangement of the hydraulic coupling between the actuator and the valve needle. With a resistor R1 across the first injector 34 having a resistance of between 300 and 500 Ohms, typically the injector will discharge to $V_{DISCHARGE}$ over a time period of about 10 to 20 ms.

Prior to a subsequent injection being demanded by the ECU 8, the high differential voltage $V_{CHARGE}$ is re-established across the first injector 34 (this is not illustrated in FIG. 3). The high voltage, $V_{CHARGE}$, is re-established across the injector 34 by re-selecting the first injector 34 by activation of the first injector select switch QS1 and carrying out the charging steps used to terminate injection, as described previously. Typically, this re-charge process will occur a few milliseconds prior to the subsequent injection.

Once the high voltage level, $V_{CHARGE}$, is re-established across the first injector 34, the injector 34 is ready to perform a subsequent injection demanded by the ECU 8. However, the benefit of having discharged the first injector 34 slowly at the end of the initial injection is that the actuator of the injector 34 experiences the high voltage level across it for a much reduced period of time compared to conventional operating methods whereby the injector remains charged to the high voltage level between injections. The method of the present invention therefore increases the service life of the actuator and, hence, increases the service life of the injector.

The aforementioned method may be applied to any of the injectors of the engine, for example the second injector 36 of the injector bank 32, in a similar manner and to similar advantage.

In an alternative embodiment to that described previously (not shown), the resistors R1 and R2 provided across the injectors 34, 36 may be removed and, instead, the discharge of the injector 34, 36 at the end of an injection, and prior to a subsequent injection, may be controlled by means of the ECU 8. In this case discharge of the injector 34, 36 at the end of an injection is controlled actively by the ECU 8, rather than passively by relying on the resistors R1, R2. At the end of an injection for the first injector 34, the injector select switch QS1 is selected again (if not already selected) and a discharge phase is initiated, at a second discharge rate RT2, by activating the discharge switch Q1. In order to control the discharge rate RT2 during this secondary discharge phase, the comparator module 46 and the discharge switch Q1 are operated by the ECU as described previously such that the current remains within predetermined limits and a predetermined average discharge current level is maintained through the first injector 34. As mentioned previously, it is essential that ECU controls the discharge switch Q1 in such a way that the second discharge rate RT2 is slow enough to ensure that the injector needle is not caused to open during this secondary discharge.

In a further alternative embodiment, the resistors R1, R2 are maintained in the injector bank circuit 32 together with additional electrical components (not shown) to control the resistors, rather than relying solely on the ECU to perform this function. The additional electrical components may include an apparatus for sensing the voltage across the actuator of the injector and for adjusting the rate of discharge of the actuator as a function of the voltage across the actuator. Alternatively, the additional electrical components may include an apparatus for discharging the actuator as a function of the time that has elapsed since the end of the last injection. In practice it would be advantageous to make use of the ECU to control the discharge between injections, either in software or by controlling the resistors R1, R2, as this would not require the additional hardware of the electrical components.

Figure 4:
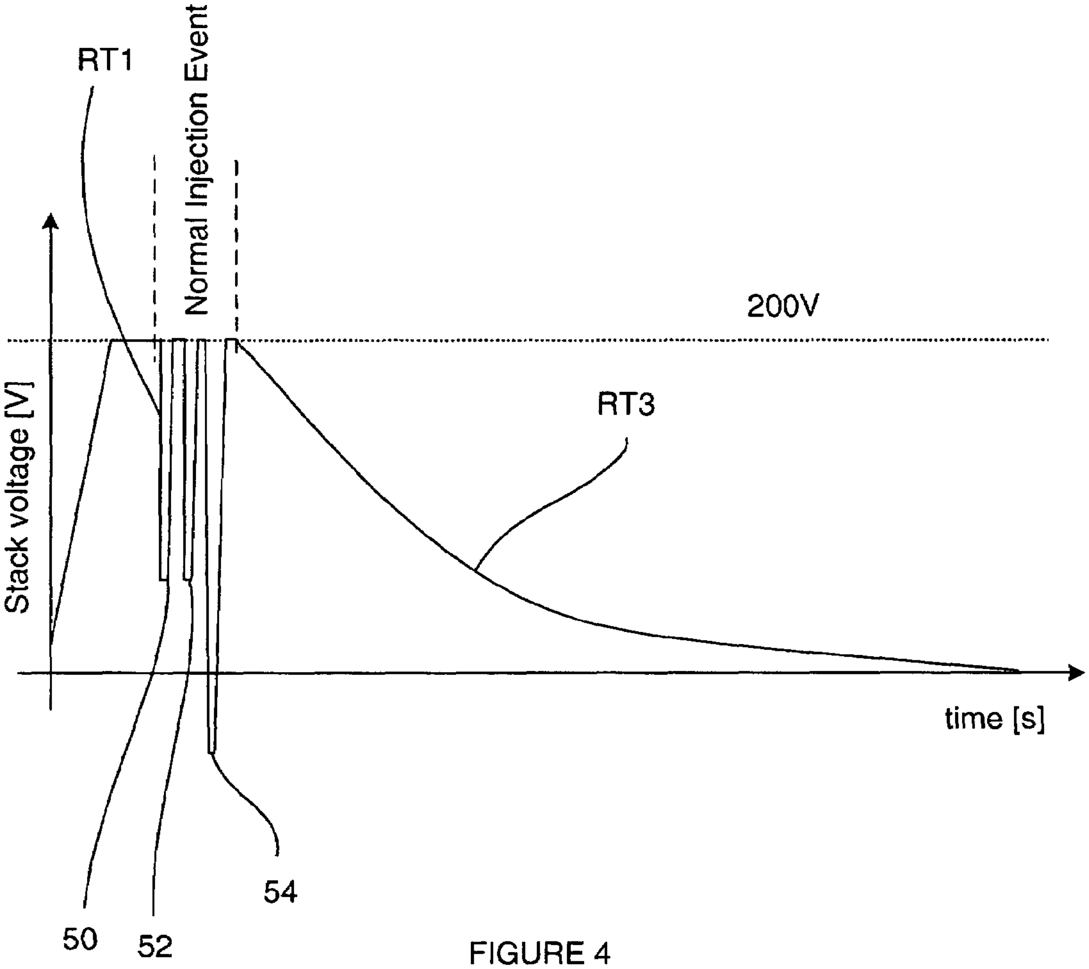
FIG. 4 is a schematic graph of voltage against time for an injection sequence having a pilot injection of fuel, followed by a main injection of fuel, followed by a post injection of fuel, as implemented in an alternative embodiment of the present invention.

In many circumstances it is desirable to have an injection sequence comprising a number of separate injections of fuel. Such an injection sequence is shown in FIG. 4, including a first pilot injection of fuel 50, followed by a second pilot injection of fuel 52, followed by a main injection of fuel 54. In some circumstances it may be important to ensure that, prior to the main injection following the second pilot injection, the voltage across the actuator of the selected injector is re-established to a sufficiently high level before the later injection is carried out. The same applies to the second pilot injection following the first pilot injection.

In the circuit of FIG. 2, this may be achieved, for example, by maintaining the injector select switch of the selected injector in an activated state for the whole injection sequence i.e. for both of the pilot injections 50, 52 and for the main injection 54. With the injector selected, the injector remains connected to the supply voltage so that, although current flows through the discharge resistor R1 or R2, this is compensated by the current flow from the supply voltage. This is the effect shown in FIG. 4, where there is no discharge of the injector between the first pilot injection 50 and the second pilot injection 52, and between the second pilot injection 52 and the main injection 54.

In some circumstances it may not be desirable to maintain the injector select switch in an activated state throughout the injection sequence. However, even with the injector select switch deactivated between injections (i.e. between the first pilot and the second pilot, and between the second pilot and the main), the voltage does not drop significantly before the start of the subsequent injection of the sequence and so performance is not compromised. Once the first pilot injection has terminated, the injector discharges at a relatively low rate (not indicated in FIG. 4), which is much less than the initial rate of discharge RT1, so that the voltage has not dropped significantly at the time when the second pilot injection 52 occurs. Likewise, the rate of discharge following the second pilot injection 52 is also relatively low so that the voltage has not dropped significantly at the time when the main injection of fuel 54 is required.

In a modification to the aforementioned method, which accommodates an injection sequence comprising more than one close-spaced injections of fuel (e.g. pilot, pilot, main), the ECU 8 may be configured to modulate the rate of voltage discharge across the selected injector as a function of time since the start of the injection sequence, rather than relying on the use of the resistors R1, R2. The injector is discharged at the first relatively high rate, RT1 (i.e. as described previously for the injection 42 in FIG. 3). The ECU 8 then controls the voltage across the injector so that it is increased to terminate the first pilot injection 50. Once the first pilot injection has terminated, the injector remains at the relatively high level until the second pilot injection 52 is initiated. As before, once the second pilot injection has terminated, the ECU 8 controls the voltage across the injector to remain high until the main injection 54 is initiated. Following the main injection 54, the ECU 8 reduces the voltage across the injector at the second rate RT3, which is considerably lower than the rate RT1 required for an injection.

If required, the ECU 8 could be used to discharge the injector between injections of a sequence at a relatively low rate (e.g. between the first pilot injection and the second pilot injection, and between the second pilot injection and the main injection). The required rates of discharge may be predetermined and stored in a look-up table of the ECU 8. If time permits, the injector may be recharged between the first and second pilot injections and/or between the second pilot injection and the main injection.

By way of further example, if the ECU 8 demands an injection strategy comprising more than one injection of fuel, an initial rate of discharge may be applied to the injector for a fixed period of time after the first pilot injection has started and, once this fixed period of time has elapsed, a second, higher rate of discharge may be applied to the injector. The fixed period of time is set to ensure all injections of the injection sequence have taken place (e.g. the pilot injections 50, 52 and the main injection 54), before the second, lower rate of discharge (e.g. RT3) is applied.

In an alternative implementation, the ECU 8 may adjust the rate of discharge according to the voltage across the injector.

In any of the aforementioned embodiments, the advantage is achieved that voltage across the actuator of an injector is reduced when it is not injecting so that, overall, the injector spends a considerably reduced amount of time in a fully charged state, therefore prolonging its service life.

Although particular embodiments of the invention have been disclosed herein in detail, this has been done by way of example and for the purposes of illustration only. The aforementioned embodiments are not intended to be limiting with respect to the scope of the appended claims, which follow. It is proposed by the inventors that various substitutions, alterations, and modifications may be made to the invention without departing from the spirit and scope of the invention as defined by the claims.

The invention claimed is:

1. A method of operating an injector having an injector valve needle and a piezoelectric actuator for controlling movement of the injector valve needle, the method comprising:

reducing the voltage across the actuator at a first rate in order to initiate an initial injection, increasing the voltage across the actuator in order to terminate the injection, and once the initial injection has terminated and before a subsequent injection is initiated, using a discharge apparatus to reduce the voltage across the actuator at a second rate, that is lower than the first rate, so as to de-energize the actuator but without initiating an injection.

2. The method as claimed in claim 1, further comprising increasing the voltage across the actuator after it has been reduced at the second rate, prior to a further subsequent injection.

3. A method of operating an injector having an injector valve needle and a piezoelectric actuator for controlling movement of the injector valve needle, the method comprising:

reducing the voltage across the actuator at a first rate in order to initiate an initial injection, increasing the voltage across the actuator in order to terminate the injection, and once the initial injection has terminated and before a subsequent injection is initiated, reducing the voltage across the actuator at a second rate, that is lower than the first rate, so as to de-energize the actuator but without initiating an injection;

including reducing the voltage across the actuator at the second rate as a function of time that has elapsed since the initial injection.

4. A method of operating an injector having an injector valve needle and a piezoelectric actuator for controlling movement of the injector valve needle, the method comprising:

reducing the voltage across the actuator at a first rate in order to initiate an initial injection, increasing the voltage across the actuator in order to terminate the injection, and once the initial injection has terminated and before a subsequent injection is initiated, reducing the voltage across the actuator at a second rate, that is lower than the first rate, so as to de-energize the actuator but without initiating an injection:

including reducing the voltage across the actuator at the second rate a predetermined time after the initial injection.

5. The method as claimed in claim 1, wherein the initial injection is an initial injection of an injection sequences and the subsequent injection is a subsequent injection of the same injection sequence.

6. The method as claimed in claim 4, wherein the initial injection is a pilot injection of the injection sequence, and the subsequent injection is a main injection of the same injection sequence.

7. The method as claimed in claim 4, wherein the initial injection is a pilot injection of the injection sequence, and the subsequent injection is a further pilot injection of the same injection sequence.

8. The method as claimed in claim 4, wherein the predetermined time is selected to be greater than the time period for the injection sequence to complete.

9. A method of operating an injector having an injector valve needle and a piezoelectric actuator for controlling movement of the injector valve needle, the method comprising:

reducing the voltage across the actuator at a first rate in order to initiate an initial injection, increasing the voltage across the actuator in order to terminate the injection, and once the initial injection has terminated and before a subsequent injection is initiated, reducing the voltage across the actuator at a second rate, that is lower than the first rate, so as to de-energize the actuator but without initiating an injection;

including reducing the voltage across the actuator at the second rate as a function of the voltage across the actuator.

10. A method of operating an injector having an injector valve needle and a piezoelectric actuator for controlling movement of the injector valve needle, the method comprising:

reducing the voltage across the actuator at a first rate in order to initiate an initial injection, increasing the voltage across the actuator in order to terminate the injection, and once the initial injection has terminated and before a subsequent injection is initiated, reducing the voltage across the actuator at a second rate, that is lower than the first rate, so as to de-energize the actuator but without initiating an injection;

further comprising reducing the voltage across the actuator at the second rate through a resistance associated with the injector.

11. A method of operating an injector having an injector valve needle and a piezoelectric actuator for controlling movement of the injector valve needle, the method comprising:

reducing the voltage across the actuator at a first rate in order to initiate an initial injection, increasing the voltage across the actuator in order to terminate the injection, and once the initial injection has terminated and before a subsequent injection is initiated, reducing the voltage across the actuator at a second rate, that is lower than the first rate, so as to de-energize the actuator but without initiating an injection;

further comprising reducing the voltage across the actuator at the second rate through a resistance across terminals of the actuator.

12. A method of operating an injector having an injector valve needle and a piezoelectric actuator for controlling movement of the injector valve needle, the method comprising:

reducing the voltage across the actuator at a first rate in order to initiate an initial injection, increasing the voltage across the actuator in order to terminate the injection, and once the initial injection has terminated and before a subsequent injection is initiated, reducing the voltage across the actuator at a second rate, that is lower than the first rate, so as to de-energize the actuator but without initiating an injection;

further comprising reducing the voltage across the actuator at the second rate actively under the control of an engine control system.

13. A computer program on a computer readable memory or storage device for execution by a computer, the computer program comprising a computer program software portion that when executed, is operable to implement a method of operating an injector having an injector valve needle and a piezoelectric actuator for controlling movement of the injector valve needle, the method comprising:

reducing the voltage across the actuator at a first rate in order to initiate an initial injection, increasing the voltage across the actuator in order to terminate the injection, and once the initial injection has terminated and before a subsequent injection is initiated, using a discharge apparatus to reduce the voltage across the actuator at a second rate, that is lower than the first rate, so as to de-energize the actuator but without initiating an injection.

14. A data storage medium having the computer program software portion of claim 13 stored thereon.

15. A microcomputer provided with the data storage medium of claim 14.

16. A method of operating a fuel injector having an injector valve needle, a valve needle seat engageable with the injector valve needle and a piezoelectric actuator for controlling movement of the injector valve needle relative to the valve needle seat, the method comprising:

reducing the voltage across the actuator at a first rate in order to initiate a first fuel injection event;

increasing the voltage across the actuator in order to terminate said first fuel injection event; and once the first fuel injection event has terminated and before a second fuel injection event is initiated, using a discharge apparatus to reduce the voltage at a second rate, said second rate being too slow to initiate a fuel injection event, and wherein said second rate is a function of the voltage across the actuator.

17. The method as claimed in claim 16, wherein said first fuel injection event and said second fuel injection event are not consecutive fuel injection events of the same fuel injection sequence.

* * * * *